United States Patent
Fagard

(10) Patent No.: US 7,663,611 B2
(45) Date of Patent: Feb. 16, 2010

(54) DISPLAY DEVICE WITH PROXIMITY DETECTION AND METHOD OF USING SAID DEVICE

(75) Inventor: Pierre Fagard, Elancourt (FR)

(73) Assignee: Thales, Neuilly sur Seine (FR)

( * ) Notice: Subject to any disclaimer, the term of this patent is extended or adjusted under 35 U.S.C. 154(b) by 535 days.

(21) Appl. No.: 10/536,349

(22) PCT Filed: Nov. 26, 2003

(86) PCT No.: PCT/EP03/50900

§ 371 (c)(1),
(2), (4) Date: Jan. 9, 2006

(87) PCT Pub. No.: WO2004/049094

PCT Pub. Date: Jun. 10, 2004

(65) Prior Publication Data

US 2006/0125717 A1     Jun. 15, 2006

(30) Foreign Application Priority Data

Nov. 28, 2002 (FR) .................................. 02 15071

(51) Int. Cl.
     *G06F 3/045*      (2006.01)
(52) U.S. Cl. ........................................ 345/174; 345/55
(58) Field of Classification Search .................. 345/104, 345/173, 174, 55
See application file for complete search history.

(56) References Cited

U.S. PATENT DOCUMENTS

| | | | | |
|---|---|---|---|---|
| 5,043,710 A | * | 8/1991 | Rydel | 345/174 |
| 5,777,596 A | * | 7/1998 | Herbert | 345/104 |
| 5,955,910 A | * | 9/1999 | Levin et al. | 327/393 |
| 6,025,726 A | * | 2/2000 | Gershenfeld et al. | 324/671 |
| 6,239,788 B1 | * | 5/2001 | Nohno et al. | 345/173 |
| 7,286,118 B2 | * | 10/2007 | Van Berkel | 345/173 |
| 7,319,456 B2 | * | 1/2008 | Fagard | 345/173 |

FOREIGN PATENT DOCUMENTS

| | | |
|---|---|---|
| EP | 0 340 096 | 11/1989 |
| EP | 0 346 211 | 12/1989 |
| FR | 2 820 869 | 8/2002 |

* cited by examiner

Primary Examiner—Chanh Nguyen
Assistant Examiner—Calvin C Ma
(74) Attorney, Agent, or Firm—Lowe Hauptman Ham & Berner, LLP

(57) ABSTRACT

The invention pertains to a display device comprising means of detection of proximity and to a method of using this device. The device comprises a liquid crystal layer, at least two electrodes making it possible to excite the liquid crystal, means for generating a control signal for the electrodes, means for generating a high frequency signal applied to the second electrode, means for detecting a modification, if any, of the high frequency signal. The device also comprises means of mixing (Rscb) of the high frequency signal and of the control signal. In the method, the means for generating a control signal provide a periodic signal comprising positive and negative alternations and the means for generating a high frequency signal inject a high frequency signal at substantially equal quantity during as many positive alternations as negative alternations of the control signal.

18 Claims, 4 Drawing Sheets

DISPLAY DEVICE WITH PROXIMITY DETECTION AND METHOD OF USING SAID DEVICE

CROSS-REFERENCE TO RELATED APPLICATIONS

The present Application is based on International Application No. PCT/EP2003/050900, filed on Nov. 26, 2003, which in turn corresponds to FR 02/15071 filed on Nov. 28, 2002, and priority is hereby claimed under 35 USC §119 based on these applications. Each of these applications are hereby incorporated by reference in their entirety into the present application.

FIELD OF THE INVENTION

The invention pertains to a display device comprising means of detection of proximity and to a method of using this device. Such devices are used in particular for the construction of communication terminals of the type allowing an operator to transmit and to receive information within the framework of a friendly exchange with a processor. The invention finds a particular application in respect of the screens of interactive terminals comprising liquid crystal, plasma, light-emitting diode or field-effect emission screens.

BACKGROUND OF THE INVENTION

Known screens comprise two plates at least one of which is transparent. Between these plates are disposed liquid crystal molecules. To excite the liquid crystal molecules and to modify the polarity of a light ray which passes through them, the screen comprises transparent electrodes situated on internal faces of the two plates. One of these electrodes is commonly called the counter-electrode. A control signal, in general of low frequency, is applied between the electrodes to excite the liquid crystal molecules and thus obtain the desired display.

It is known to construct interactive communication terminals by disposing one or more transparent touch layers on the device, these being based on contact or on capacitive or inductive effect or the like. The device can then serve to delimit pressing zones of this pad according to a desired composition. The pressing of the layer is usually done by a finger of an operator. The drawbacks associated with these known methods relate to the cost of the sensitive component added to the screen and to the fact that the visual information provided by the device is inevitably altered by the add-on touch pads.

To remedy this problem, European patent EP 0 340 096 proposes that the surface of the counter-electrode of a liquid crystal screen be used as replacement for add-on touch layers. This counter-electrode has a significant area in relation to the area of the finger of the operator, this being well suited to the detection of a finger by capacitive effect. By way of example, such a screen allows the displaying of numerical characters each composed of seven segments which may either be lit or unlit. A counter-electrode of this type of screen generally covers one or more predefined locations of characters.

Patent EP 0 340 096 describes the application of a high frequency signal to the counter-electrode. The high frequency signal is attenuated by the presence of the finger of a user in proximity to the screen and opposite the counter-electrode. The detection of the attenuation of the high frequency signal makes it possible to detect the presence of the finger.

Patent EP 0 340 096 describes the independent application of the control signal and of the high frequency signal so as not to disturb one another; this independent application requires that one of the signals be interrupted in order to apply the other. This does not make it possible to modify the display and to detect the presence of the finger simultaneously.

SUMMARY OF THE INVENTION

The invention aims to alleviate this problem by proposing means making it possible to apply the control signal and the high frequency signal simultaneously.

To this end, the subject of the invention is an electronic display device comprising means of detection of proximity of a conducting element situated in proximity to a display zone of the device, the device comprising two insulating plates, a layer of material exhibiting electro-optical properties suitable for rendering all or part of its surface visible under the effect of an electrical control signal, the layer being disposed between the two plates, at least one first electrode disposed on a first face of one of the insulating plates, a second electrode disposed on a second face of the other insulating plate opposite at least one first electrode, means for generating a control signal for the electrodes as a function of an image to be displayed on the display zone, means for generating a high frequency signal applied to the second electrode, means for detecting a modification, if any, of the high frequency signal, characterized in that the device furthermore comprises means of mixing of the high frequency signal and of the control signal that are disposed in such a way as to allow the operation of the means of detection of proximity independently of the operation of the means for generating a control signal.

A subject of the invention is also the method of using the device described above, characterized in that the means for generating a control signal provide a periodic signal comprising positive and negative alternations, in that the means for generating a high frequency signal inject a high frequency signal at substantially equal quantity during as many positive alternations as negative alternations of the control signal.

The invention is particularly adapted to static display devices of dedicated type or that are weakly multiplexed. Specifically, these types of displays include no electronic breaker constructed directly on the electrodes allowing display. In the presence of such a breaker on an electrode its opening makes it possible to raise the impedance of this electrode and to apply the high frequency signal to the counter-electrode situated opposite.

In the absence of any breaker on the electrode, the impedance of the electrode may be less easily raised and there is a risk that the application of the high frequency signal may modify the display.

The invention makes it possible to alleviate this problem by supervising the mixing of the high frequency signal and the control signal thereby allowing the operation of the means of detection of proximity independently of the operation of the means for generating a control signal.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description thereof are to be regarded as illustrative in nature, and not as restrictive.

BRIEF DESCRIPTION OF THE DRAWINGS

The invention will be better understood and other advantages will become apparent on reading the detailed description of an embodiment given by way of example, which description is illustrated by the appended drawing in which.

DETAILED DESCRIPTION OF THE INVENTION

Figure 1:
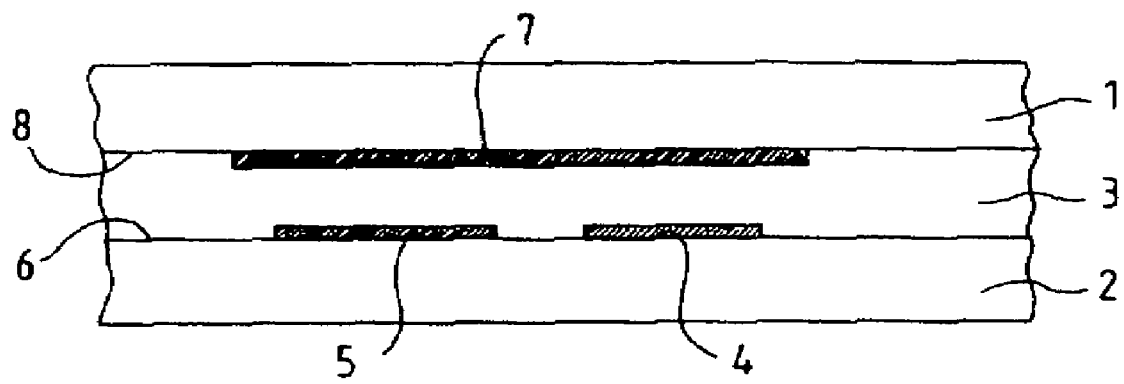
FIG. 1 represents in section a dedicated display device.

The display device represented in FIG. 1 comprises two insulating plates 1 and 2 disposed one above the other. At least one of the two plates 1 or 2 is transparent. The device also comprises a layer 3 made of a material exhibiting electro-optical properties able to transmit or otherwise a luminous radiation under the effect of an electrical excitation. This material comprises for example liquid crystal. The device comprises two first electrodes 4 and 5 having for example the form of a pictogram. These two first electrodes are disposed on a face 6 of the insulating plate 2. The device furthermore comprises a second electrode 7, also called a counter-electrode 7, disposed on a face 8 of the other insulating plate 1. The layer 3 is disposed between the faces 6 and 8 of the two insulating plates 1 and 2. The faces 6 and 8 are the faces of the plates closest to the layer 3. These faces are also called the internal faces of the insulating plates 1 and 2. The second electrode 7 is disposed opposite the two first electrodes 4 and 5 so that a control signal applied between one of the first electrodes and the second electrode 7 modifies the state of the liquid crystal between the electrodes.

In FIG. 1 only three electrodes 4, 5 and 7 have been represented by way of example. It is of course understood that the invention may be implemented regardless of the number of electrodes.

Figure 2A:
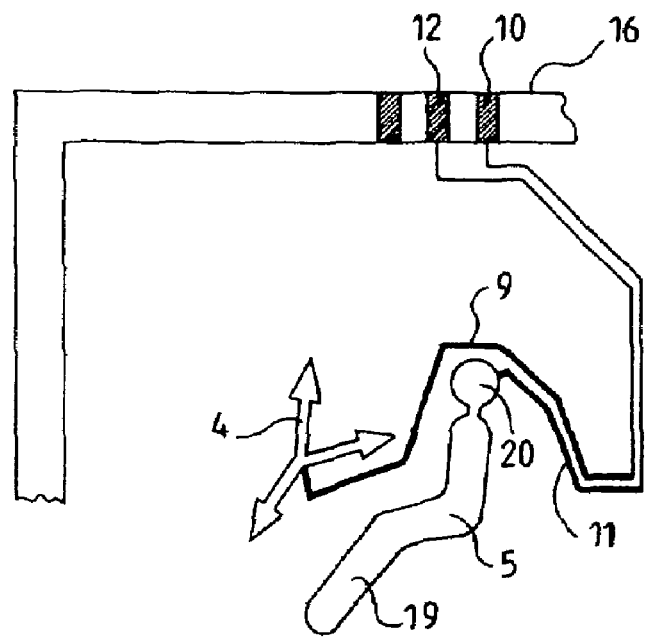
FIGS. 2a and 2b represent an example of electrodes of a display device in accordance with the invention.

FIG. 2a represents an exemplary pictogram constructed with the aid of the electrodes 4 and 5. The pictogram of the electrode 4 represents three concurrent arrows and the pictogram of the electrode 5 represents a seated human silhouette. These two pictograms may represent for example the state of the ventilation in a motor vehicle. The electrode 4 is linked electrically by a pad 9 to a connection tag 10. The same holds for the electrode 5 which is linked by a pad 11 to a connection tag 12. The tags 10 and 12 make it possible to apply the control signal of the device to the electrodes 4 and 5. The tags 10 and 12 are situated on an edge 16 of the device.

Figure 2B:
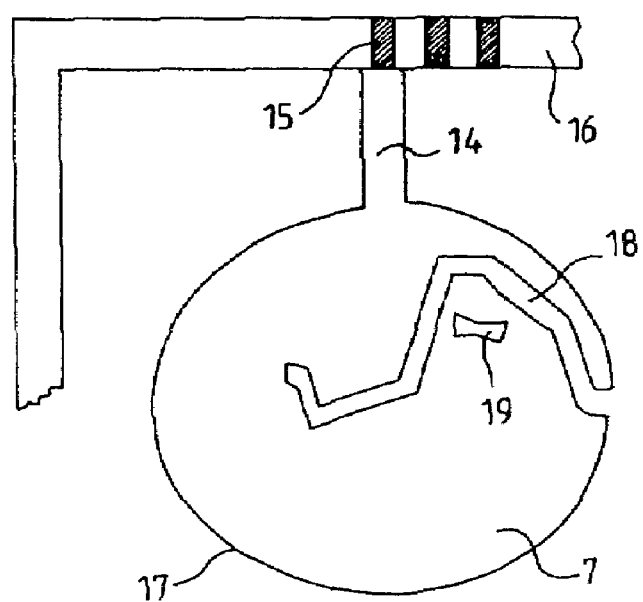

FIG. 2b represents the electrode 7 and its electrical connection pad 14. The pad 14 makes it possible to feed the electrode 7 via a tag 15 situated on the edge 16 of the device. In the exemplary embodiment represented, an exterior contour 17 of the electrode 7 is substantially oval. When the electrode 7 is placed opposite the electrodes 4 and 5, the latter are situated inside the contour 17. Stated otherwise, the electrode 7 completely covers the electrodes 4 and 5. Thus the area of the electrode 7 is greater than or equal to the sum of the areas of the electrodes 4 and 5. To ensure correct operation of the detection of proximity by capacitive effect, the electrode 7 must have an area of at least 9 mm$^2$. The capacitive effect is obtained by placing a finger of a user on the device opposite the electrode 7. A capacitance is then created between the electrode 7 and the finger. By injecting a high frequency electrical signal, for example 2 MHz, onto electrode 7, it is possible to detect the presence of the finger by analyzing a possible weakening of the high frequency signal due to the existence of the capacitance created between the finger and the electrode 7. Trials have shown that if the area of the electrode 7 is less than 9 mm$^2$, the weakening of the high frequency signal is so small that it is practically impossible to detect.

Advantageously, the electrode 7 is profiled opposite the pads 9 and 10. More precisely, the modification of state of the liquid crystal is obtained by applying a low frequency control signal, for example of 100 Hz, between on the one hand the electrode 7 and on the other hand at least one of the electrodes 4 or 5. The pads 9 and 11 are in part opposite the electrode 7 or more precisely inside the contour 17 of the electrode 7. If the electrode 7 occupies the whole of the area situated inside the contour 17, the parts of the pads 9 and 11 opposite the electrode 7 are then visible at the same time as the pictograms formed by the electrodes 4 and 5. To alleviate this defect and to allow only the pictograms to appear, the electrode 7 is profiled opposite the pads. A profiling 18 is clearly visible in FIG. 2b. The two FIGS. 2a and 2b are represented on the same scale and by overlaying them, the profiling 18 covers the part of the pads 9 and 11 that is situated inside the contour 17. This overlay prefigures the disposition of the electrodes 4, 5 and 7 in the device. In FIG. 2b, another profiling 19 made in the electrode 7 is also distinguished, making it possible, once the electrodes 4, 5 and 7 have been overlaid to visually separate the body 19 from the head 20 in the representation of the human silhouette constructed with the aid of the electrode 5.

Advantageously, the device comprises several counter-electrodes 7. To ensure the detection of presence of a conducting element in proximity to each counter-electrode 7, each is fed separately. More precisely, each possesses its own pad 14 each ending at a distinct tag 15.

Figure 3:
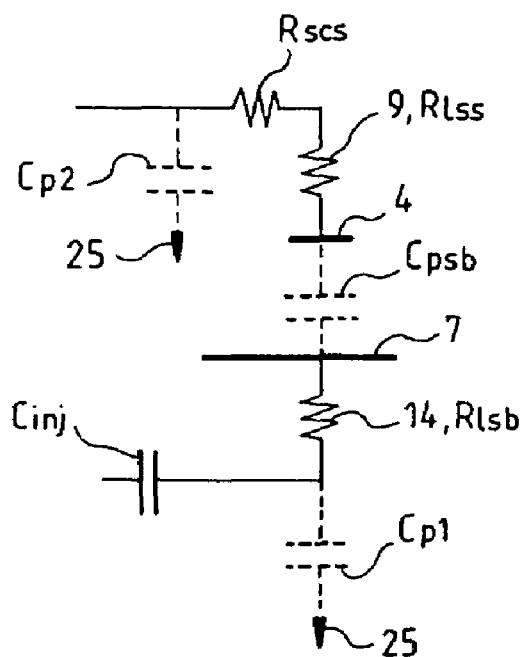
FIG. 3 represents a schematic modeling of the operation of a display device comprising a liquid crystal screen.

FIG. 3 makes it possible to explain the manner of operation of an elementary display cell formed by a first electrode, for example the electrode 4 and a second electrode 7 situated opposite. Liquid crystal molecules are placed between the two electrodes 4 and 7 and form an insulating material a few μm thick. The two electrodes then form a capacitor Cpsb also called the capacitor of the elementary cell LCD. The electrical connection of the first electrode 4 is ensured by the pad 9 forming a resistor Rlss whose value is advantageously adapted by etching of the feed pad 9 of the first electrode 4. More precisely, the value of the resistor Rlss is adapted by modifying the length and/or the width and/or the thickness of the feed pad 9.

If the value of the resistor Rlss is insufficient, an additional resistor Rscs for example in the form of a discrete component may be added in series with the pad 9. Capacitive losses in the electrical connection of the electrode 4 may be modeled by a capacitor Cp2 linked between a terminal of the resistor Rscs not connected to the pad 9 and the electrical earth 25.

The electrical connection of the second electrode 7 is ensured by the pad 14 forming a resistor Rlsb. Capacitive losses in the electrical connection of the electrode 7 may be modeled by a capacitor Cp1 linked between the end of the pad 14 not connected to the electrode 7 and the earth 25. A capacitor Cinj connected to the common point of the capacitor Cp1 and of the pad 14 makes it possible to inject a high frequency signal onto the second electrode 7.

Figure 4:
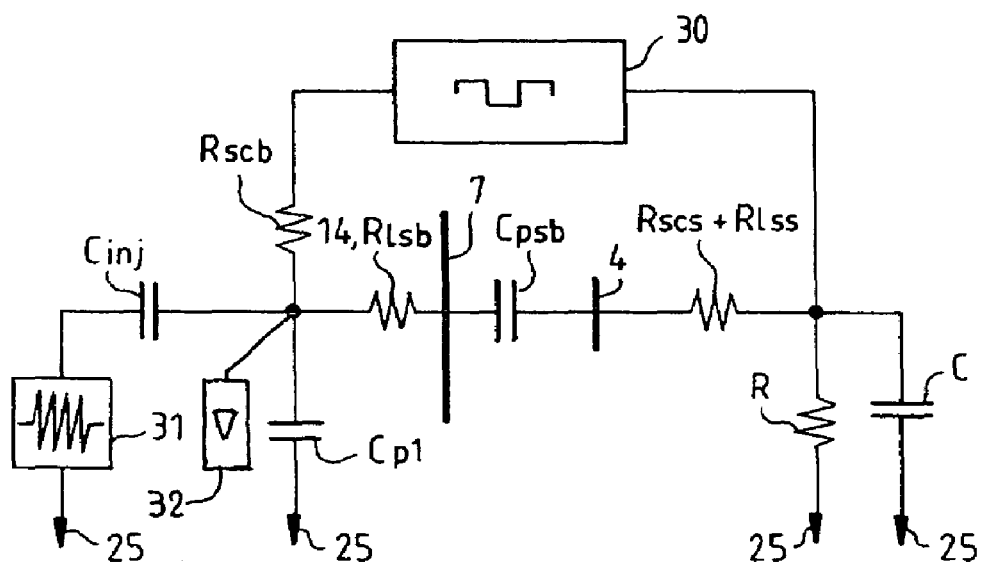
FIG. 4 diagrammatically represents a display device in accordance with the invention.

FIG. 4 completes the elements described in FIG. 3 by describing the way in which a control signal and a high frequency signal are applied to the electrodes 4 and 5. More precisely the device comprises means for generating the control signal 30, which means are formed by an alternating low frequency voltage source and are connected between on the one hand the terminal of the resistor Rscs not connected to the resistor Rlss and on the other hand the common point of the pad 14 and of the injection capacitor Cinj. The means for generating the control signal 30 are, at their common points shared with the resistor Rscs, connected to the earth 25 by way of a low impedance formed for example of a resistor R and of a capacitor C connected in parallel. This impedance is an example of modeling of the output impedance of the generator. The device furthermore comprises means for generating a high frequency signal 31, which means are connected between the earth 25 and the terminal of the injection capacitor Cinj not connected to the pad 14. Means 32 for detecting a modification, if any, of the high frequency signal are linked to the second electrode 7 by way of the resistor Rlsb and more precisely to the common point of the injection capacitor Cinj and of the resistor Rlsb.

According to the invention, the device comprises means of mixing of the high frequency signal and of the control signal. These means comprise a resistor Rscb connected in series with the low frequency voltage source 30. The value of the resistor Rscb is for example between 1 kilo-ohm and 100 kilo-ohms.

Advantageously, the value of the resistor Rscb is at least of the order of magnitude of the impedance of the injection capacitor Cinj at the frequency of the high frequency signal. Thus the fact of mixing the control signal and the high frequency signal by means of the resistor Rscb does not overly attenuate the high frequency signal. For example, if the high frequency signal has a frequency of 2 MHz, and if an injection capacitor Cinj of 10 pF is chosen, the value adopted for the resistor Rscb will not be less than around 5 kilo-ohms.

Advantageously, the value of the resistor Rlsb of the feed pad 14 of the electrode 7 is less than 5 k ohms so as to limit the attenuation of the signals received by the electrode 7.

Advantageously, the value of the resistor Rlss is adapted in such a way that a time constant $\tau$ formed by the capacitor Cpsb and the resistor Rlss is at least of an order of magnitude smaller than a period of the control signal. The expression smaller order of magnitude is understood to mean around ten times smaller. Thus the control signal will have a much bigger voltage across the terminals of the capacitor Cpsb than across the terminals of the resistor Rlss. As was seen previously, the resistor Rlss may be supplemented with the additional resistor Rscs. In this case, the two resistors Rlss and Rscs will have to be taken into account for the calculation of the time constant $\tau$.

Advantageously, the value of the time constant is greater than or equal to a period of the high frequency signal. Thus the high frequency signal will have a much bigger voltage across the terminals of the resistor Rlss, possibly supplemented with the additional resistor Rscs, than across the terminals of the capacitor Cpsb. Thus the LCD cell will be almost undisturbed by the application of the high frequency voltage.

Advantageously, when the device comprises at least two electrodes 4 and 5 of different area disposed opposite a second electrode 7, the value of the resistor Rlss, possibly supplemented with the additional resistor Rscs, of each electrode 4 or 5 increases with the inverse of the area of the electrode 4 or 5 considered. Stated otherwise, the smaller the area of an electrode 4 or 5 the more the value of the resistor Rlss, possibly supplemented with the additional resistor Rscs, will be increased so as thus to preserve the same time constant $\tau$ for all the first electrodes 4 and 5.

The subject of the invention is also a method of using a device as previously described, the means for generating a control signal 30 provide a periodic signal comprising positive and negative alternations in which method. The means for generating a high frequency signal 31 inject a high frequency signal at substantially equal quantity during as many positive alternations and as negative alternations of the control signal 30. This makes it possible to avoid any asymmetries in the application of the high frequency signal to the LCD cell. Specifically such a cell may be damaged in the event of the application of a dc voltage component across the terminals of its electrodes, which dc component results from the asymmetric application of a signal.

Advantageously, the high frequency signal is interrupted during switchings between the positive and negative alternations of the control signal 30. Specifically during these switchings, the application of the high frequency signal could lead, in the same manner as previously, to a voltage imbalance that may induce the application of a dc component across the terminals of the electrodes. This temporal constraint on the injection of the high frequency signal is much less penalizing than that existing in an embodiment in accordance with the teaching of patent EP 0 340 096 in which it was necessary to interrupt the control signal in order to inject the high frequency signal.

Advantageously, the duration and/or the amplitude of the high frequency signal delivered by the means for generating a high frequency signal 31 are such that the effective value of the high frequency signal is less than a threshold voltage of the layer 3. The threshold voltage of the layer 3 is defined as a voltage suitable for causing the state of the liquid crystal to change, for causing it to pass from a transparent state to an opaque state or the converse. More precisely, the threshold voltage depends on the hardware components of the cell itself and also on the cell's multiplexing rate. In the case of a device comprising several cells, the smallest threshold voltage will be that of the cell having the smallest time constant $\tau$. Additionally, the amplitude of the high frequency signal acts directly on the rms value of the high frequency signal and the expression duration of the high frequency signal is understood to mean the duration within an alternation of the control signal as well as the number of alternation of the control signal where the high frequency signal appears.

Figure 5:
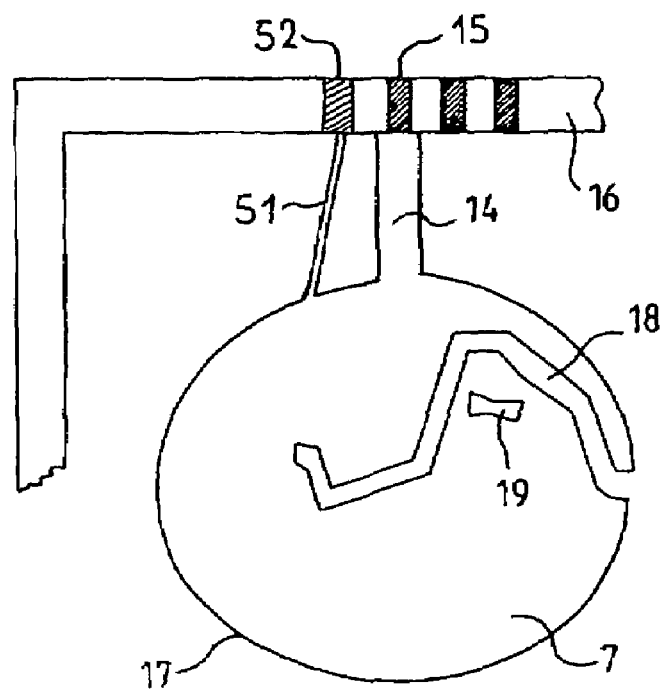
FIG. 5 represents an advantageous variant embodiment of one of the electrodes of a dedicated display device.

FIG. 5 represents an advantageous variant embodiment of one of the electrodes of a dedicated display device. In this variant, the resistor Rscb, connected in series with the low frequency voltage source 30, is advantageously embodied by exploiting the natural resistance of an additional connection pad 51 for the electrode 7. The pad 51 is distinct from the pad 14 and links the electrode 7 to the low frequency voltage source 30 by way of a tag 52 situated on the edge of the device. The tag 52 is distinct from the tag 15. As for the resistor Rlss, the value of the resistor Rscb is advantageously adapted by etching of the pad 51 of the electrode 7.

Figure 6:
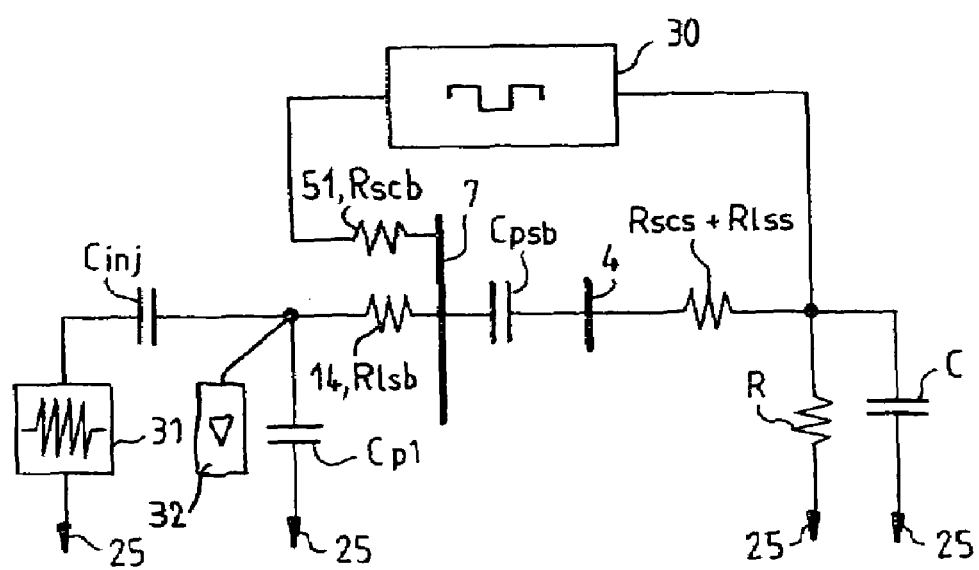
FIG. 6 represents a schematic modeling of the operation of a display device comprising the electrode represented in FIG. 5.

FIG. 6 represents a schematic modeling of the manner of operation of a display device comprising the electrode 7 represented in FIG. 5. The variant embodiment represented with the aid of FIGS. 5 and 6 makes it possible to dispense with mixing means effected outside the display and to use the design of the electrode 7 to effect these mixing means.

It will be readily seen by one of ordinary skill in the art that the present invention fulfills all of the objects set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

The invention claimed is:

1. An electronic display device comprising means of detection of proximity of a conducting element situated in proximity to a display zone of the device, the device comprising:
   two insulating plates;
   a layer of material exhibiting electro-optical properties configured to render at least a portion of its surface visible under the effect of an electrical control signal, the layer being disposed between the two plates;
   at least one first electrode disposed on a face of one of the insulating plates;
   a second electrode disposed on a face of the other insulating plate opposite at least one first electrode;
   means for generating an image display zone control signal and outputting the image display zone control signal to the second electrode as a function of an image to be displayed on the display zone;
   means for generating a high frequency signal applied to the second electrode;
   means for detecting a modification of the high frequency signal independent of applying the image display zone control signal to the second electrode; and
   means of mixing the high frequency signal and the image display zone control signal, the mixing means operable to add the high frequency signal and the image display zone control signal, whereby the image display zone control signal and the high frequency signal are applied simultaneously to the second electrode.

2. The device as claimed in claim 1, wherein the means for generating the image display zone control signal comprise a low frequency voltage source (30) whose first terminal is linked to the first electrode and a second terminal of which is linked to the second electrode, in that the means for generating the high frequency signal are linked to the second electrode, in that the mixing means comprise a first resistor (Rscb) connected in series with the low frequency voltage source.

3. The device as claimed in claim 2, wherein the means for detecting a modification, if any, of the high frequency signal are linked to the second electrode.

4. The device as claimed in claim 2, wherein the value of the first resistor (Rscb) lies between 1 kilo-ohm and 100 kilo-ohms.

5. The device as claimed in claim 2, wherein the means for generating the high frequency signal (31) are linked to the second electrode (7) by way of an injection capacitor (Cinj), and in that the value of the first resistor (Rscb) is at least of the order of magnitude of the impedance of the injection capacitor (Cinj) at the frequency of the high frequency signal.

6. The device as claimed in claim 1, wherein the second electrode is linked to the means for generating the image display zone control signal and to the means for generating the high frequency signal by a feed pad whose resistance value (Rlsb) is less than 5 k ohms.

7. The device as claimed in claim 1, wherein the first electrode and the second electrode form a capacitor (Cpsb), in that the first electrode is linked to the means for generating the image display zone control signal by way of a second resistor (Rlss+Rscs) whose value is adapted so that a time constant ($\tau$) formed by the capacitor (Cpsb) and the second resistor (Rlss+Rscs) is at least of an order of magnitude smaller than a period of the image display zone control signal.

8. The device as claimed in claim 7, wherein the value of the time constant ($\tau$) is greater than or equal to a period of the high frequency signal.

9. The device as claimed in claim 7, wherein the value of the second resistor (Rlss+Rscs) is adapted by etching of a feed pad (9, Rlss) of the first electrode.

10. The device as claimed in claim 9, wherein the value of the second resistor (Rlss+Rscs) is adapted by modifying the length and/or the width and/or the thickness of the feed pad (9, Rlss) of the first electrode.

11. The device as claimed in claim 7, wherein the second resistor (Rlss+Rscs) comprises an additional resistor (Rscs) connected in series with the feed pad (9, Rlss) of the first electrode.

12. The device as claimed in claim 7, wherein it comprises at least two first electrodes of different area disposed opposite a second electrode, in that the value of the second resistor (Rlss+Rscs) of each first electrode increases with the inverse of the area of the first electrode considered.

13. The device as claimed in claim 1, wherein the second electrode comprises two distinct connection pads each linked by distinct lugs.

14. The device as claimed in claim 13, wherein the first of the lugs is linked to the means for generating a high frequency signal, and the second of the lugs is linked to the means for generating an image display zone control signal.

15. The device as claimed in claim 14, wherein a value of the mixing means (Rscb) is adapted by etching of the pad linked to the second of the lugs.

16. A method of using a device as claimed in claim 1, wherein the means for generating an image display zone control signal (30) provide a periodic signal comprising positive and negative alternations, in that the means for generating a high frequency signal (31) inject a high frequency signal at substantially equal quantity during as many positive alternations as negative alternations of the image display zone control signal (30).

17. The method as claimed in claim 16, wherein the high frequency signal is interrupted during switchings between the positive and negative alternations of the image display zone control signal (30).

18. The method as claimed in claim 16, wherein the duration and/or the amplitude of the high frequency signal delivered by the means for generating a high frequency signal are such that the effective value of the high frequency signal is less than a threshold voltage of the layer.

* * * * *